United States Patent
Negoro et al.

(10) Patent No.: US 9,555,452 B2
(45) Date of Patent: Jan. 31, 2017

(54) SUBSTRATE TREATMENT METHOD AND SUBSTRATE TREATMENT APPARATUS

(71) Applicant: DAINIPPON SCREEN MFG. CO., LTD., Kyoto (JP)

(72) Inventors: Sei Negoro, Kyoto (JP); Yasuhiko Nagai, Kyoto (JP); Keiji Iwata, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 0 days.

(21) Appl. No.: 14/456,007

(22) Filed: Aug. 11, 2014

(65) Prior Publication Data

US 2015/0068557 A1   Mar. 12, 2015

(30) Foreign Application Priority Data

Sep. 10, 2013   (JP) ................. 2013-187627

(51) Int. Cl.
*B08B 7/00*   (2006.01)
*B08B 3/10*   (2006.01)
*H01L 21/67*   (2006.01)

(52) U.S. Cl.
CPC ............ *B08B 3/10* (2013.01); *H01L 21/6715* (2013.01); *H01L 21/67028* (2013.01); *H01L 21/67103* (2013.01); *B08B 7/00* (2013.01); *B08B 7/0035* (2013.01); *B08B 7/0064* (2013.01); *B08B 7/0071* (2013.01)

(58) Field of Classification Search
CPC ................ B08B 3/10; H01L 21/67028; H01L 21/67103; H01L 21/6715; H01L 7/00;H01L 7/0035; H01L 7/0064; H01L 7/0071

See application file for complete search history.

(56) References Cited

U.S. PATENT DOCUMENTS

| | | | |
|---|---|---|---|
| 5,120,509 A * | 6/1992 | Zavracky | C30B 29/06 118/641 |
| 6,355,909 B1 * | 3/2002 | Griffiths | C23C 16/46 118/724 |
| 2004/0121617 A1 | 6/2004 | Kawano et al. | 438/781 |
| 2004/0253839 A1 * | 12/2004 | Shimizu | H01L 21/76855 438/795 |
| 2005/0205521 A1 | 9/2005 | Kume | 216/87 |
| 2006/0004493 A1 * | 1/2006 | Hwang | G05D 23/27 700/300 |
| 2007/0272680 A1 | 11/2007 | Tadokoro et al. | 219/494 |
| 2008/0142051 A1 * | 6/2008 | Hashizume | H01L 21/67023 134/23 |
| 2009/0032498 A1 | 2/2009 | Tsuchiya | 216/92 |

(Continued)

FOREIGN PATENT DOCUMENTS

CN   1497662 A   5/2004
JP   05-121388   5/1993

(Continued)

*Primary Examiner* — Bibi Carrillo
(74) *Attorney, Agent, or Firm* — Ostrolenk Faber LLP

(57) ABSTRACT

A substrate treatment method is provided, which includes a liquid film retaining step of retaining a liquid film of a treatment liquid on a major surface of a substrate, and a heater heating step of locating a heater in opposed relation to the major surface of the substrate to heat the treatment liquid film by the heater in the liquid film retaining step, wherein an output of the heater is changed from a previous output level in the heater heating step.

7 Claims, 12 Drawing Sheets

(56) References Cited

U.S. PATENT DOCUMENTS

| | | | | |
|---|---|---|---|---|
| 2010/0323528 A1* | 12/2010 | Baba | ................. | H01L 21/67109 |
| | | | | 438/758 |
| 2012/0080061 A1* | 4/2012 | Kim | ....................... | F26B 5/005 |
| | | | | 134/95.2 |
| 2012/0138097 A1 | 6/2012 | Okron-Schmidt | .............. | 134/19 |
| 2012/0260947 A1* | 10/2012 | Kaneko | .................... | B08B 3/10 |
| | | | | 134/19 |
| 2013/0224956 A1* | 8/2013 | Negoro | ............ | H01L 21/31111 |
| | | | | 438/697 |
| 2014/0331927 A1* | 11/2014 | Nakano | ................... | H01L 21/00 |
| | | | | 118/641 |
| 2015/0047677 A1* | 2/2015 | Muramoto | ........ | H01L 21/67051 |
| | | | | 134/19 |
| 2015/0060407 A1* | 3/2015 | Negoro | ............... | C11D 3/0052 |
| | | | | 216/92 |
| 2015/0072078 A1* | 3/2015 | Negoro | .................... | G03F 7/00 |
| | | | | 427/346 |

FOREIGN PATENT DOCUMENTS

| | | |
|---|---|---|
| JP | 2005-032819 | 2/2005 |
| JP | 2007-324548 | 12/2007 |
| JP | 2008-066400 | 3/2008 |
| JP | 2012-156264 | 8/2012 |
| JP | 2013-065823 | 4/2013 |
| JP | 2013-521658 | 6/2013 |
| WO | WO 2011/109540 A1 | 9/2011 |
| WO | WO 2013/031390 A1 | 3/2013 |

* cited by examiner

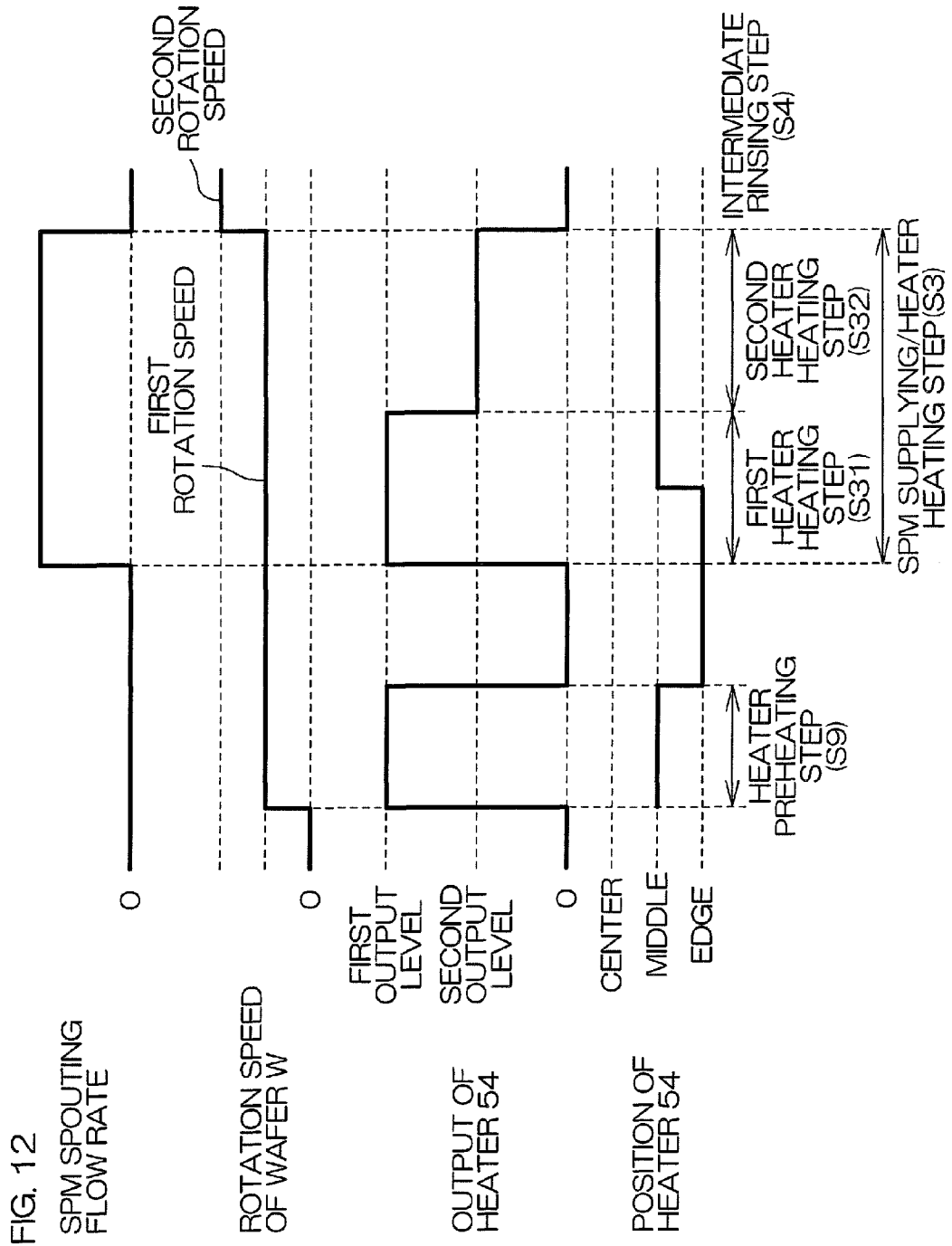

SUBSTRATE TREATMENT METHOD AND SUBSTRATE TREATMENT APPARATUS

BACKGROUND OF THE INVENTION

1. Field of the Invention

The present invention relates to a substrate treatment method and a substrate treatment apparatus. Exemplary substrates to be treated include semiconductor wafers, substrates for liquid crystal display devices, substrates for plasma display devices, substrates for FED (Field Emission Display) devices, substrates for optical disks, substrates for magnetic disks, substrates for magneto-optical disks, substrates for photo masks, ceramic substrates and substrates for solar cells.

2. Description of Related Art

Semiconductor device production processes include the step of locally implanting an impurity (ions) such as phosphorus, arsenic or boron, for example, into a front surface of a semiconductor substrate (hereinafter referred to simply as "wafer"). In order to prevent the ion implantation into am unnecessary portion of the wafer, a resist pattern of a photosensitive resin is formed on the front surface of the wafer to mask the unnecessary portion of the wafer with the resist in this step. After the ion implantation, the resist pattern formed on the front surface of the wafer becomes unnecessary and, therefore, a resist removing process is performed for removing the unnecessary resist.

In a typical example of the resist removing process, the front surface of the wafer is irradiated with oxygen plasma to ash the resist on the front surface of the wafer. Then, a chemical liquid such as a sulfuric acid/hydrogen peroxide mixture (SPM liquid which is a liquid mixture of sulfuric acid and a hydrogen peroxide solution) is supplied to the front surface of the wafer to remove the ashed resist. Thus, the resist is removed from the front surface of the wafer.

However, the irradiation with the oxygen plasma for the ashing of the resist damages a portion of the front surface of the wafer uncovered with the resist (e.g., an oxide film exposed from the resist).

Therefore, a method of lifting off the resist from the front surface of the wafer by the strong oxidative power of peroxosulfuric acid ($H_2SO_5$) contained in the SPM liquid supplied onto the front surface of the wafer without ashing the resist has recently been attracting attention (see, for example, JP2005-32819A).

SUMMARY OF THE INVENTION

The resist formed on the wafer subjected to the ion implantation is liable to be altered (hardened).

One method of imparting the SPM liquid with a higher resist lift-off capability is to heat the SPM liquid on the front surface of the wafer, particularly a portion of the SPM liquid present around an interface between the front surface of the wafer and the SPM liquid, to a higher temperature (e.g., 200° C. or higher). With this method, even a resist having a hardened surface layer can be removed from the front surface of the wafer without the ashing. One conceivable method for keeping the SPM liquid at a higher temperature around the interface between the front surface of the wafer and the SPM liquid is to continuously supply the higher temperature SPM liquid to the wafer. However, this method increases the use amount of the SPM liquid.

The inventors of the present invention contemplate to cover the entire front surface of the wafer with a liquid film of the SPM liquid, while heating the SPM liquid film by means of a heater disposed in opposed relation to the front surface of the wafer. More specifically, a heater having a smaller diameter than the front surface of the wafer is employed as the heater, and the heater is moved along the front surface of the wafer while being energized for heating.

If the output of the heater is set at a relatively high output level in the resist removing process, the SPM liquid film can be heated to a higher temperature and, therefore, the resist having the hardened surface layer can be removed. In addition, the resist lift-off efficiency can be significantly increased, thereby reducing the process time required for the resist lift-off process.

In this case, however, the resist layer on the front surface of the wafer is overheated, resulting in damage to the front surface of the wafer (damage to a pattern formed on the front surface). If the output of the heater is set at a relatively low output level, the damage can be prevented. In this case, however, the resist lift-off efficiency with respect to the front surface of the wafer is reduced.

It is therefore an object of the present invention to provide a substrate treatment method and a substrate treatment apparatus which ensure that a major surface of a substrate can be advantageously treated with the use of a heater without any damage thereto.

According to the present invention, there is provided a substrate treatment method, which includes a liquid film retaining step of retaining a liquid film of a treatment liquid on a major surface of a substrate, and a heater heating step of locating a heater in opposed relation to the major surface of the substrate to heat the treatment liquid film by the heater in the liquid film retaining step, wherein an output of the heater is changed from a previous output level in the heater heating step.

In this method, the output of the heater is changed from the previous output level in the heater heating step. At the initial stage of the heater heating step, for example, the output of the heater may be set at a relatively high output level, and then set at a relatively low output level. This makes it possible to impart the treatment liquid film retained on the major surface of the substrate with a very high treatment capability without damaging the major surface of the substrate by the heating with the heater. As a result, the major surface of the substrate can be advantageously treated with the use of the heater without any damage thereto.

According to one embodiment of the present invention, the heater heating step includes a first heater heating step of setting the output of the heater at a first output level to heat the treatment liquid film in the liquid film retaining step, and a second heater heating step of changing the output of the heater to a second output level lower than the first output level to heat the treatment liquid film after the first heater heating step in the liquid film retaining step.

In this method, the first heater heating step is performed with the output of the heater set at the relatively high first output level, and then the second heater heating step is performed with the output of the heater changed to the second output level lower than the first output level.

In the first heater heating step, the treatment liquid film retained on the major surface of the substrate is heated to a higher temperature by the heater. As a result, the treatment liquid film can exhibit a very high treatment capability. Thus, the major surface of the substrate can be advantageously treated with the treatment liquid. Before the major surface of the substrate is overheated, the first heater heating step ends, and then the second heater heating step is performed with the output of the heater set at a lower output level. Therefore, the major surface of the substrate is prevented from being damaged. In the second heater heating step, the output of the heater is set at a relatively low output level. Even in this case, the treatment liquid can be maintained at a higher temperature, whereby the major surface of the substrate can be advantageously treated.

Thus, the major surface of the substrate can be advantageously treated with the use of the heater without any damage thereto. The second output level is herein defined to include an output level of zero.

The substrate treatment method may further include a heater moving step of moving the heater along the major surface of the substrate in the heater heating step.

In this method, the heater heating step and the heater moving step are simultaneously performed. Therefore, the major surface of the substrate is prevented from being locally intensively heated in the heater heating step. Thus, the major surface of the substrate can be more advantageously treated with the treatment liquid.

The substrate treatment method may further include a heater preheating step of preliminarily heating the substrate before the heater heating step.

In this method, the heater preheating step is performed to preliminarily heat the substrate with the heater before the heater heating step. If the heater preheating step is not performed, the treatment liquid is supplied to a cold substrate. Therefore, a predetermined period of time is required to sufficiently heat the treatment liquid film retained on the major surface of the substrate. Until the treatment liquid film is sufficiently heated, the treatment liquid exhibits insufficient treatment capability, thereby requiring a longer treatment period.

Where the heater preheating step is performed, on the other hand, the substrate is preliminarily warmed. Therefore, the heating of the treatment liquid is started simultaneously with the supply of the treatment liquid to the major surface of the substrate, thereby reducing the time required for sufficiently heating the treatment liquid film retained on the major surface of the substrate. That is, the period required for the treatment with the treatment liquid can be reduced. As a result, the consumption of the treatment liquid can be effectively reduced.

The treatment liquid may be a resist lift-off liquid containing sulfuric acid. In this case, the resist lift-off liquid containing sulfuric acid is used as the treatment liquid for removing a resist formed on the major surface of the substrate. In the first heater heating step, the liquid film of the resist lift-off liquid retained on the major surface of the substrate is heated to a higher temperature by the heater. As a result, the resist lift-off liquid can exhibit a very high resist lift-off capability. Therefore, even if the resist has a hardened surface layer, the hardened layer can be advantageously removed. Then, the first heater heating step ends before the major surface of the substrate is overheated. A residue of the resist remains on the major surface of the substrate after the hardened surface layer is mostly removed in the first heater heating step. Even with a lower output level of the heater, therefore, the remaining resist can be removed if the resist lift-off liquid has a relatively high liquid temperature. In other words, the hardened layer is partly or entirely removed, so that the resist can be removed with the use of a resist lift-off liquid having a relatively low liquid temperature.

The second heater heating step is performed after the end of the first heater heating step. In the second heater heating step, the output of the heater is set at a lower output level than in the first heater heating step. Even in this case, the resist lift-off liquid is maintained at a higher temperature. Therefore, the resist remaining on the major surface of the substrate can be advantageously removed in the second heater heating step.

Thus, even the resist having the hardened layer can be advantageously removed from the major surface of the substrate without asking. At this time, the major surface of the substrate is not damaged.

According to the present invention, there is provided a substrate treatment apparatus, which includes a substrate holding unit which holds a substrate, a treatment liquid supplying unit which supplies a treatment liquid to a major surface of the substrate held by the substrate holding unit, a heater to be located in opposed relation to the major surface of the substrate, and a control unit which controls the heater to perform a heater heating step for heating the treatment liquid supplied to the major surface of the substrate and to change an output of the heater from a previous output level in the heater heating step.

With this arrangement, the output of the heater is changed from the previous output level in the heater heating step. At the initial stage of the heater heating step, for example, the output of the heater is set at a relatively high output level. The output of the heater may thereafter be set at a relatively low output level. In this case, the treatment liquid film retained on the major surface of the substrate can exhibit a very high treatment capability without damaging the major surface of the substrate by the heating with the heater. As a result, the major surface of the substrate can be advantageously treated with the use of the heater without any damage thereto.

The foregoing and other objects, features and effects of the present invention will become more apparent from the following detailed description of the preferred embodiments with reference to the attached drawings.

BRIEF DESCRIPTION OF THE DRAWINGS

FIG. 12 is a time chart showing an exemplary resist removing process according to a second embodiment of the present invention.

DETAILED DESCRIPTION OF THE INVENTION

Figure 1A:
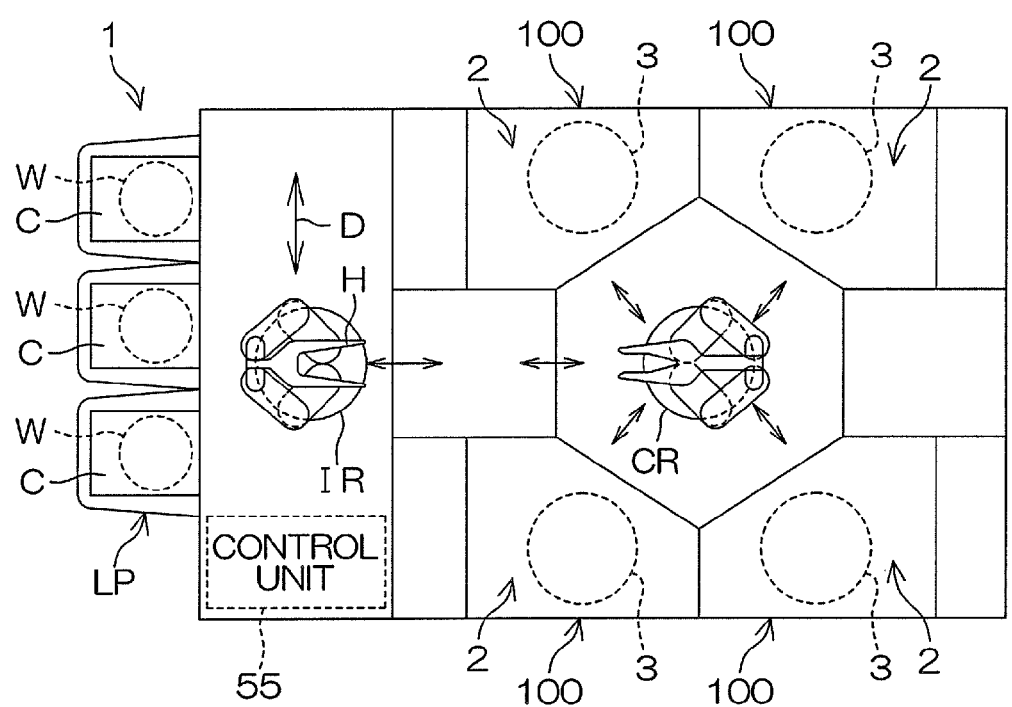
FIG. 1A is a schematic plan view showing the schematic construction of a substrate treatment apparatus according to a first embodiment of the present invention.

FIG. 1A is a schematic plan view showing the schematic construction of a substrate treatment apparatus 1 according to a first embodiment of the present invention.

As shown in FIG. 1A, the substrate treatment apparatus 1 is of a single substrate treatment type to be used for removing an unnecessary resist from a front surface (major surface) of a wafer W (exemplary substrate) doped with an impurity in an ion implantation process.

The substrate treatment apparatus 1 includes a load port LP serving as a container retaining unit which retains a plurality of carriers C (containers), and a plurality of treatment units 100 (12 treatment units 100 in this embodiment) which each treat a wafer W. The treatment units 100 are disposed in vertically stacked relation.

The substrate treatment apparatus 1 further includes an indexer robot IR (transport robot) which transports a wafer W between the load port LP and a center robot CR, the center robot CR (transport robot) which transports a wafer W between the indexer robot IR and the treatment units 100, and a control unit 55 which controls the operations of devices provided in the substrate treatment apparatus 1 and the opening and closing of valves.

As shown in FIG. 1A, the load port LP is horizontally spaced from the treatment units 100. The carriers C each adapted to contain a plurality of wafers W are arranged in a horizontal arrangement direction D as seen in plan. The indexer robot IR transports the wafers W one by one from the carriers C to the center robot CR, and transports the wafers W one by one from the center robot CR to the carriers C. Similarly, the center robot CR transports the wafers W one by one from the indexer robot IR to the treatment units 100. Further, the center robot CR transports a wafer W between the treatment units 100 as required.

The indexer robot IR includes two hands H each having a U-shape as seen in plan. The two hands H are disposed at different height levels. The hands H each horizontally hold a wafer W. The indexer robot IR moves its hands H horizontally and vertically. The indexer robot IR rotates (turns) about its vertical axis to change the orientations of the hands H. The indexer robot IR is movable in the arrangement direction D along a path extending through a transfer position (a position shown in FIG. 1A). The transfer position is such that the indexer robot IR and the center robot CR are opposed to each other perpendicularly to the arrangement direction D as seen in plan. The indexer robot IR locates its hands H in opposed relation to a desired one of the carriers C or the center robot CR. The indexer robot IR moves its hands H to perform a loading operation to load a wafer W to any of the carriers C and perform an unloading operation to unload a wafer W from any of the carriers C. The indexer robot IR cooperates with the center robot CR to perform a transfer operation at the transfer position to transfer a wafer W from one of the indexer robot IR and the center robot CR to the other robot.

Similarly to the indexer robot IR, the center robot CR includes two hands H each having a U-shape as seen in plan. The two hands H are disposed at different height levels. The hands H each horizontally hold a wafer W. The center robot CR moves the hands H horizontally and vertically. The center robot CR rotates (turns) about its vertical axis to change the orientations of the hands H. The center robot CR is surrounded by the treatment units as seen in plan. The center robot CR locates its hands H in opposed relation to a desired one of the treatment units 100 and the indexer robot IR. The center robot CR moves its hands H to perform a loading operation to load a wafer W to any of the treatment units 100 and perform an unloading operation to unload a wafer W from any of the treatment units 100. The center robot CR cooperates with the indexer robot IR to perform a transfer operation to transfer a wafer W from one of the indexer robot IR and the center robot CR to the other robot.

Figure 1B:
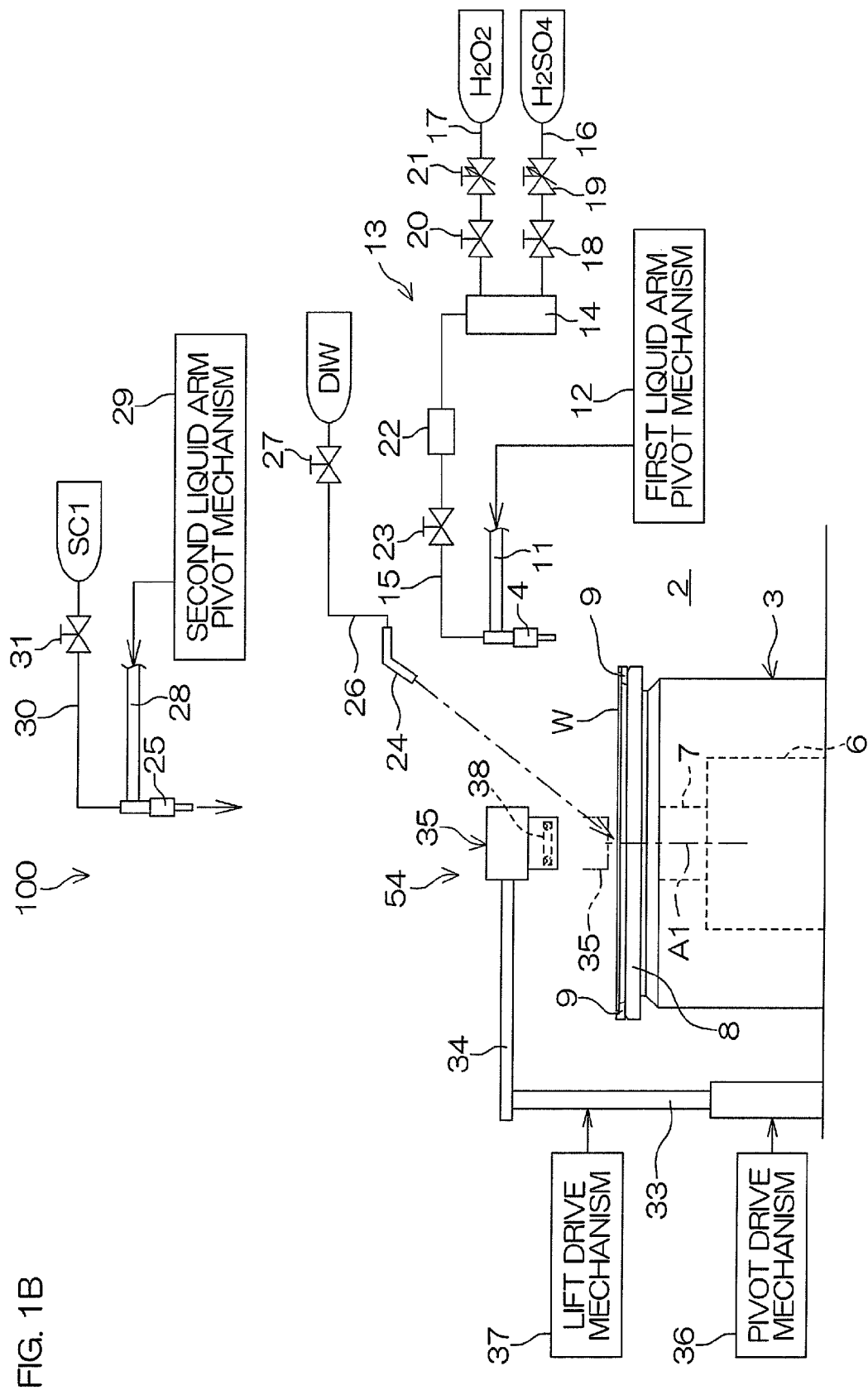
FIG. 1B is a diagram schematically showing the construction of a treatment unit of the substrate treatment apparatus.

FIG. 1B is a diagram schematically showing the construction of each of the treatment units 100 which perform a substrate treatment method according to the first embodiment of the present invention.

The treatment units 100 each include a treatment chamber 2 defined by a partition wall (see FIG. 1A), a wafer holding mechanism 3 (substrate holding unit) which holds a wafer W, a lift-off liquid nozzle 4 which supplies an SPM liquid (exemplary resist lift-off liquid) to a front surface (upper surface) of the wafer W held by the wafer holding mechanism 3, and a heater 54 which is located in opposed relation to the front surface of the wafer W held by the wafer holding mechanism 3 to heat the wafer W and a liquid film of the SPM liquid retained on the wafer W. The wafer holding mechanism 3, the lift-off nozzle 4 and the heater 54 are disposed in the treatment chamber 2.

The wafer holding mechanism 3 is, for example, of a clamping type. More specifically, the wafer holding mechanism 3 includes a rotative drive mechanism 6, a spin shaft 7 integral with a drive shaft of the rotative drive mechanism 6, a disk-shaped spin base 8 generally horizontally attached to an upper end of the spin shaft 7, and a plurality of clamping members 9 provided generally equiangularly circumferentially of the spin base 8. The rotative drive mechanism 6 is, for example, an electric motor. The clamping members 9 generally horizontally clamp the wafer W. When the rotative drive mechanism 6 is driven in this state, the spin base 8 is rotated about a predetermined vertical rotation axis A1 by the driving force of the rotative drive mechanism 6. Thus, the wafer W is rotated about the rotation axis A1 together with the spin base 8 while being generally horizontally held.

The wafer holding mechanism 3 is not limited to the clamping type, but may be, for example, of a vacuum suction type, which sucks a back surface of the wafer W by vacuum to horizontally hold the wafer W and, in this state, is rotated about the rotation axis A1 to rotate the wafer W thus held.

The lift-off liquid nozzle 4 is, for example, a straight nozzle which spouts the SPM liquid in the form of a continuous stream. The lift-off liquid nozzle 4 is attached to a distal end of a generally horizontally extending first liquid arm 11 with its spout directed downward. The first liquid arm 11 is pivotal about a predetermined vertical pivot axis (not shown). A first liquid arm pivot mechanism 12 for pivoting the first liquid arm 11 within a predetermined angular range is connected to the first liquid arm 11. The lift-off liquid nozzle 4 is moved between a position on the rotation axis A1 of the wafer W (at which the lift-off liquid nozzle 4 is opposed to the rotation center of the wafer W) and a home position defined on a lateral side of the wafer holding mechanism 3 by pivoting the first liquid arm 11.

A lift-off liquid supply mechanism 13 (treatment liquid supplying unit) for supplying the SPM liquid to the lift-off liquid nozzle 4 includes a mixing portion 14 for mixing sulfuric acid ($H_2SO_4$) and hydrogen peroxide solution ($H_2O_2$), and a lift-off liquid supply line 15 connected between the mixing portion 14 and the lift-off liquid nozzle 4. A sulfuric acid supply line 16 and a hydrogen peroxide solution supply line 17 are connected to the mixing portion 14. Sulfuric acid temperature-controlled at a predetermined temperature (e.g., about 80° C.) is supplied to the sulfuric acid supply line 16 from a sulfuric acid supply portion (not shown) to be described later. On the other hand, a hydrogen peroxide solution not temperature-controlled but having a temperature generally equal to a room temperature (about 25° C.) is supplied to the hydrogen peroxide solution supply line 17 from a hydrogen peroxide solution supply source (not shown).

A sulfuric acid valve 18 and a flow rate control valve 19 are provided in the sulfuric acid supply line 16. Further, a hydrogen peroxide solution valve 20 and a flow rate control valve 21 are provided in the hydrogen peroxide solution supply line 17. In the lift-off liquid supply line 15, an agitation flow pipe 22 and a lift-off liquid vale 23 are provided in this order from the side of the mixing portion 14. The agitation flow pipe 22 is configured such that a plurality of rectangular planar agitation fins each twisted by about 180 degrees about an axis extending in a liquid flowing direction are provided in a tubular member so as to be angularly offset from each other by 90 degrees about a center axis of the tubular member extending in the liquid flowing direction.

When the sulfuric acid valve 18 and the hydrogen peroxide solution valve 20 are opened with the lift-off liquid valve 23 being open, sulfuric acid from the sulfuric acid supply line 16 and the hydrogen peroxide solution from the hydrogen peroxide solution supply line 17 flow into the mixing portion 14, and then flow out of the mixing portion 14 into the lift-off liquid supply line 15. Sulfuric acid and the hydrogen peroxide solution flow through the agitation flow pipe 22 to be thereby sufficiently agitated when flowing through the lift-off liquid supply line 15. With the agitation in the agitation flow pipe 22, sulfuric acid and the hydrogen peroxide solution sufficiently react with each other, whereby an SPM liquid containing a great amount of peroxosulfuric acid ($H_2SO_5$) is prepared. The SPM liquid is heated to a temperature level higher than the liquid temperature of sulfuric acid supplied to the mixing portion 14 by reaction heat generated by the reaction between sulfuric acid and the hydrogen peroxide solution. The SPM liquid having a higher temperature is supplied to the lift-off liquid nozzle 4 through the lift-off liquid supply line 15.

In this embodiment, sulfuric acid is stored in a sulfuric acid tank (not shown) of the sulfuric acid supply portion (not shown). Sulfuric acid stored in the sulfuric acid tank is temperature-controlled at a predetermined temperature (e.g., about 80° C.) by a temperature controller (not shown). Sulfuric acid stored in the sulfuric acid tank is supplied to the sulfuric acid supply line 16. In the mixing portion 14, sulfuric acid having a temperature of about 80° C. is mixed with the hydrogen peroxide solution kept at a room temperature, whereby an SPM liquid having a temperature of about 140° C., for example, is prepared. The SPM liquid having a temperature of about 140° C. is spouted from the lift-off liquid nozzle 4.

The treatment units 100 each further include a DIW nozzle 24 from which DIW (deionized water) is supplied as a rinse liquid onto the front surface of the wafer W held by the wafer holding mechanism 3, and an SC1 nozzle 25 from which SC1 (an ammonia-hydrogen peroxide mixture) is supplied as a cleaning chemical liquid onto the front surface of the wafer W held by the wafer holding mechanism 3.

The DIW nozzle 24 is a straight nozzle which spouts the DIW, for example, in the form of a continuous stream, and is fixedly disposed above the wafer holding mechanism 3 with its spout directed toward around the rotation center of the wafer W. The DIW nozzle 24 is connected to a DIW supply line 26 to which the DIW is supplied from a DIW supply source. A DIW valve 27 for switching on and off the supply of the DIW from the DIW nozzle 24 is provided in the DIW supply line 26.

The SC1 nozzle 25 is a straight nozzle which spouts the SC1, for example, in the form of a continuous stream, and is fixed to a distal end of a generally horizontally extending second liquid arm 28 with its spout directed downward. The second liquid arm 28 is pivotal about a predetermined vertical pivot axis (not shown). A second liquid arm pivot mechanism 29 for pivoting the second liquid arm 28 within a predetermined angular range is connected to the second liquid arm 28. The SC1 nozzle 25 is moved between a center position on the rotation axis A1 of the wafer W (at which the SC1 nozzle 25 is opposed to the rotation center of the wafer W) and a home position defined on a lateral side of the wafer holding mechanism 3 by pivoting the second liquid arm 28.

The SC1 nozzle 25 is connected to an SC1 supply line 30 to which the SC1 is supplied from an SC1 supply source. An SC1 valve 31 for switching on and off the supply of the SC1 from the SC1 nozzle 25 is provided in the SC1 supply line 30.

A vertically extending support shaft 33 is disposed on a lateral side of the wafer holding mechanism 3. A horizontally extending heater arm 34 is connected to an upper end of the support shaft 33, and a heater 54 is attached to a distal end of the heater arm 34. A pivot drive mechanism 36 which rotates the support shaft 33 about its rotation axis and a lift drive mechanism 37 which moves up and down the support shaft 33 along its center axis are connected to the support shaft 33.

A driving force is inputted to the support shaft 33 from the pivot drive mechanism 36 to rotate the support shaft 33 within a predetermined angular range, whereby the heater arm 34 is pivoted about the support shaft 33 above the wafer W held by the wafer holding mechanism 3. By pivoting the heater arm 34, the heater 54 is moved between a position on the rotation axis A1 of the wafer W (at which the heater 54 is opposed to the rotation center of the wafer W) and a home position defined on a lateral side of the wafer holding mechanism 3. Further, a driving force is inputted to the support shaft 33 from the lift drive mechanism 37 to move up and down the support shaft 33, whereby the heater 54 is moved up and down between a position adjacent to the front surface of the wafer W held by the wafer holding mechanism 3 (a height position indicated by a two-dot-and-dash line in FIG. 1B, and including a middle adjacent position, an edge adjacent position and a center adjacent position to be described later) and a retracted position above the wafer W (a height position indicated by a solid line in FIG. 1B). In this embodiment, the adjacent position is defined so that a lower end face of the heater 54 is spaced a distance of, for example, 3 mm from the front surface of the wafer W held by the wafer holding mechanism 3.

Figure 2:
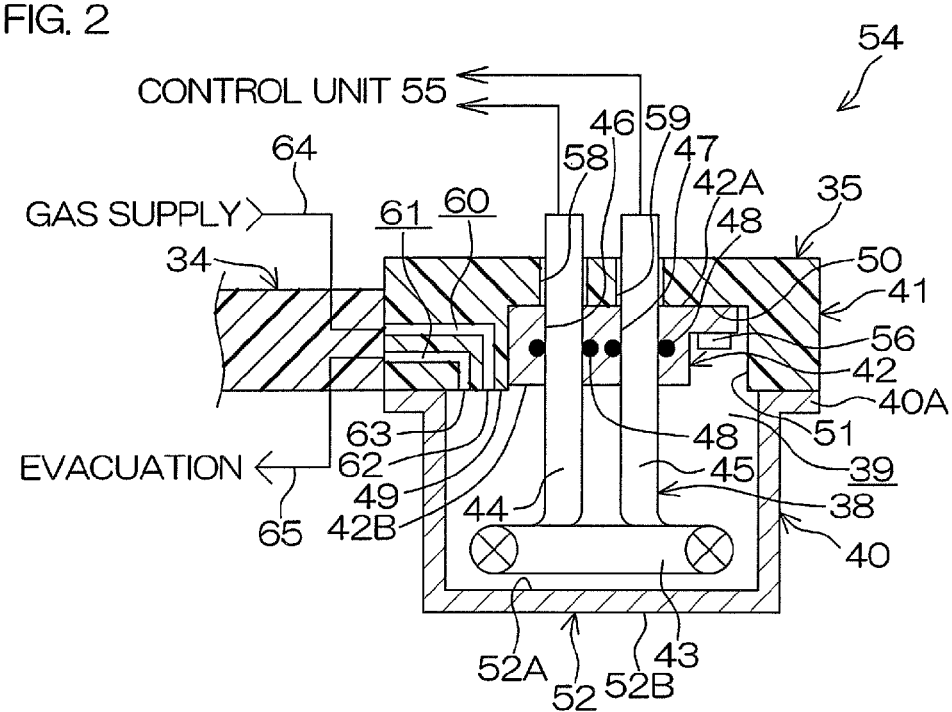
FIG. 2 is a schematic sectional view of a heater shown in FIG. 1B.
Figure 3:
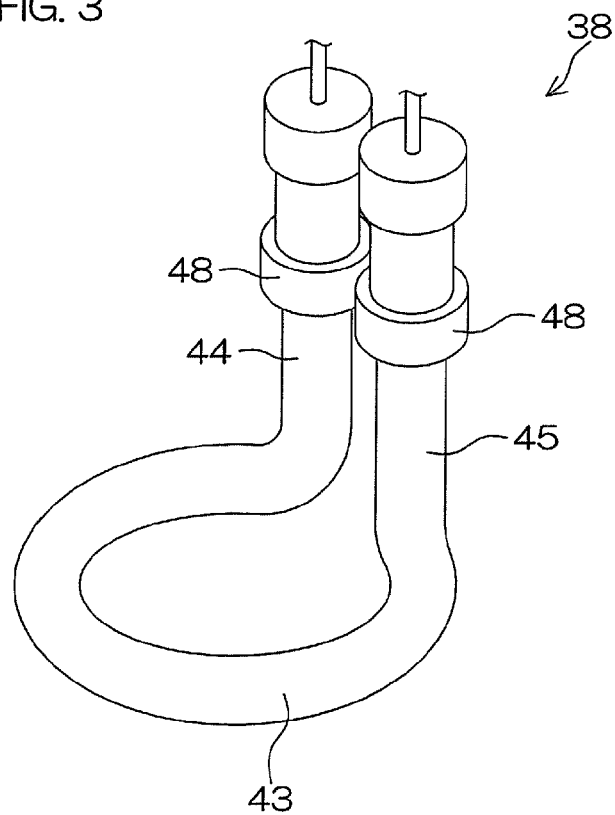
FIG. 3 is a perspective view of an infrared lamp shown in FIG. 2.
Figure 4:
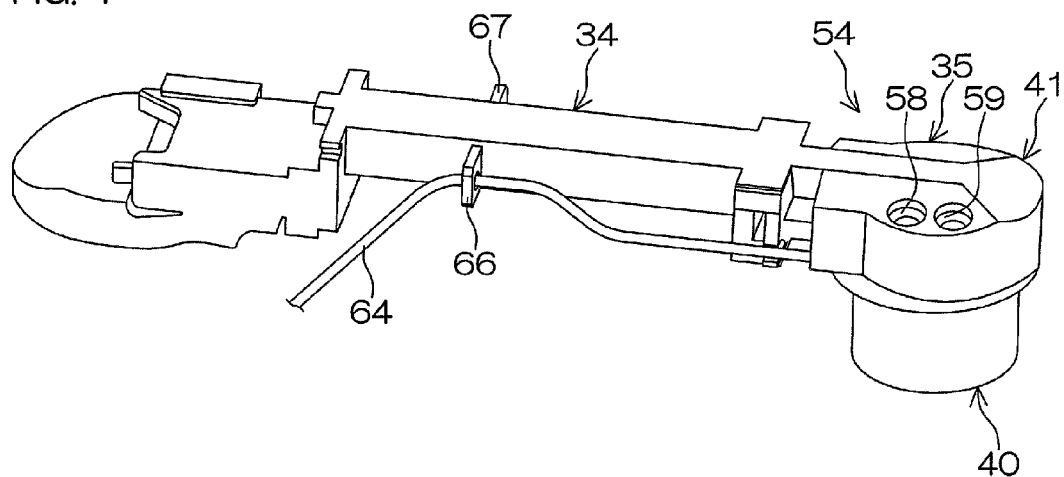
FIG. 4 is a perspective view of a heater arm and the heater shown in FIG. 1B.

FIG. 2 is a schematic sectional view of the heater 54. FIG. 3 is a perspective view of an infrared lamp 38. FIG. 4 is a perspective view of the heater arm 34 and the heater 54.

As shown in FIG. 2, the heater 54 includes a heater head 35, an infrared lamp 38, a lamp housing 40 which is a bottomed container having a top opening 39 and accommodating the infrared lamp 38, a support member 42 which supports the infrared lamp 38 while suspending the infrared lamp 38 in the lamp housing 40, and a lid 41 which closes the opening 39 of the lamp housing 40. In this embodiment, the lid 41 is fixed to the distal end of the heater arm 34.

As shown in FIGS. 2 and 3, the infrared lamp 38 is a unitary infrared lamp heater which includes an annular portion 43 having an annular shape, and a pair of straight portions 44, 45 extending vertically upward from opposite ends of the annular portion 43 along a center axis of the annular portion 43. The annular portion 43 mainly functions as a light emitting portion which emits infrared radiation. In this embodiment, the annular portion 43 has an outer diameter of, for example, about 60 mm. With the infrared lamp 38 supported by the support member 42, the center axis of the annular portion 43 vertically extends. In other words, the center axis of the annular portion 43 is perpendicular to the front surface of the wafer W held by the wafer holding mechanism 3. The annular portion 43 of the infrared lamp 38 is disposed in a generally horizontal plane.

The infrared lamp 38 includes a quartz glass tube, and a filament accommodated in the quartz tube. Typical examples of the infrared lamp 38 include infrared heaters of shorter wavelength, intermediate wavelength and longer wavelength such as halogen lamps and carbon lamps. A control unit 55 is connected to the infrared lamp 38 for power supply to the infrared lamp 38.

As shown in FIGS. 2 and 4, the lid 41 has a disk shape, and is fixed to the heater arm 34 as extending longitudinally of the heater arm 34. The lid 41 is formed of a fluororesin such as PTFE (polytetrafluoroethylene). In this embodiment, the lid 41 is formed integrally with the heater arm 34. However, the lid 41 may be formed separately from the heater arm 34. Exemplary materials for the lid 41 other than the resin material such as PTFE include ceramic materials and quartz glasses.

As shown in FIG. 2, the lid 41 has a groove 51 (having a generally cylindrical shape) formed in a lower surface 49 thereof. The groove 51 has a horizontal flat upper base surface 50, and an upper surface 42A of the support member 42 is fixed to the upper base surface 50 in contact with the upper base surface 50. As shown in FIGS. 2 and 4, the lid 41 has insertion holes 58, 59 extending vertically through the upper base surface 50 and a lower surface 42B. Upper end portions of the straight portions 44, 45 of the infrared lamp 38 are respectively inserted in the insertion holes 58, 59. In FIG. 4, the heater head 35 is illustrated with the infrared lamp 38 removed therefrom.

As shown in FIG. 2, the lamp housing 40 of the heater head 35 is a bottomed cylindrical container. The lamp housing 40 is formed of quartz glass.

In the heater head 35, the lamp housing 40 is fixed to the lower surface 49 of the lid 41 (fixed to a portion of the lower surface 49 of the lid 41 not formed with the groove 51 in this embodiment) with its opening 39 facing up. An annular flange 40A projects radially outward (horizontally) from a peripheral edge of the opening of the lamp housing 40. The flange 40A is fixed to the lower surface 49 of the lid 41 with fixture members such as bolts (not shown), whereby the lamp housing 40 is supported by the lid 41.

A bottom plate 52 of the lamp housing 40 has a horizontal disk shape. The bottom plate 52 has an upper surface 52A and a lower surface 52B which are horizontal flat surfaces. In the lamp housing 40, a lower portion of the annular portion 43 of the infrared lamp 38 is located in closely opposed relation to the upper surface 52A of the bottom plate 52. The annular portion 43 and the bottom plate 52 are parallel to each other. In other words, the lower portion of the annular portion 43 is covered with the bottom plate 52 of the lamp housing 40. In this embodiment, the lamp housing 40 has an outer diameter of, for example, about 85 mm. Further, a vertical distance between a lower end of the infrared lamp 38 (a lower portion of the annular portion 43) and the upper surface 52A is, for example, about 2 mm.

The support member 42 is a thick plate having a generally disk shape. The support member 42 is horizontally attached and fixed to the lid 41 from below by bolts 56 or the like. The support member 42 is formed of a heat-resistant material (e.g., a ceramic or quartz glass). The support member 42 has two insertion holes 46, 47 extending vertically through the upper surface 42A and the lower surface 42B thereof. The straight portions 44, 45 of the infrared lamp 38 are respectively inserted in the insertion holes 46, 47.

O-rings 48 are respectively fixedly fitted around intermediate portions of the straight portions 44, 45. With the straight portions 44, 45 respectively inserted in the insertion holes 46, 47, outer peripheries of the O-rings 48 are kept in press contact with inner walls of the corresponding insertion holes 46, 47. Thus, the straight portions 44, 45 are prevented from being withdrawn from the insertion holes 46, 47, whereby the infrared lamp 38 is suspended to be supported by the support member 42.

The emission of the infrared radiation from the heater 54 is controlled by the control unit 55. More specifically, when the control unit 55 controls the heater 54 to supply electric power to the infrared lamp 38, the infrared lamp 38 starts emitting infrared radiation. The infrared radiation emitted from the infrared lamp 38 is outputted through the lamp housing 40 downward of the heater head 35. In the resist removing process to be described later, the bottom plate 52 of the lamp housing 40 which defines the lower end face of the heater head 35 is located in opposed relation to the front surface of the wafer W held by the wafer holding mechanism 3 and, in this state, the infrared radiation outputted through the bottom plate 52 of the lamp housing 40 heats the wafer W and the SPM liquid present on the wafer W. Since the annular portion 43 of the infrared lamp 38 assumes a horizontal attitude, the infrared radiation can be evenly applied onto the front surface of the wafer W horizontally held. Thus, the wafer W and the SPM liquid present on the wafer W can be efficiently irradiated with the infrared radiation.

In the heater head 35, the periphery of the infrared lamp 38 is covered with the lamp housing 40. Further, the flange 40A of the lamp housing 40 and the lower surface 49 of the lid 41 are kept in intimate contact with each other circumferentially of the lamp housing 40. Further, the opening 39 of the lamp housing 40 is closed by the lid 41. Thus, an atmosphere containing droplets of the SPM liquid around the front surface of the wafer W is prevented from entering the lamp housing 40 and adversely influencing the infrared lamp 38 in the resist removing process to be described later. Further, the SPM liquid droplets are prevented from adhering onto the quartz glass tube wall of the infrared lamp 38, so that the amount of the infrared radiation emitted from the infrared lamp 38 can be stabilized for a longer period of time.

The lid 41 includes a gas supply passage 60 through which air is supplied into the lamp housing 40, and an evacuation passage 61 through which an internal atmosphere of the lamp housing 40 is expelled. The gas supply passage 60 and the evacuation passage 61 respectively have a gas supply port 62 and an evacuation port 63 which are open in the lower surface of the lid 41. The gas supply passage 60 is connected to one of opposite ends of a gas supply pipe 64. The other end of the gas supply pipe 64 is connected to an air supply source. The evacuation passage 61 is connected to one of opposite ends of an evacuation pipe 65. The other end of the evacuation pipe 65 is connected to an evacuation source.

While air is supplied into the lamp housing 40 from the gas supply port 62 through the gas supply pipe 64 and the gas supply passage 60, the internal atmosphere of the lamp housing 40 is expelled to the evacuation pipe 65 through the evacuation port 63 and the evacuation passage 61. Thus, a higher-temperature atmosphere in the lamp housing 40 can be expelled for ventilation. Thus, the inside of the lamp housing 40 can be cooled. As a result, the infrared lamp 38 and the lamp housing 40, particularly the support member 42, can be advantageously cooled.

As shown in FIG. 4, the gas supply pipe 64 and the evacuation pipe 65 (not shown in FIG. 4, but see FIG. 2) are respectively supported by a gas supply pipe holder 66 provided on the heater arm 34 and an evacuation pipe holder 67 provided on the heater arm 34.

Figure 5:
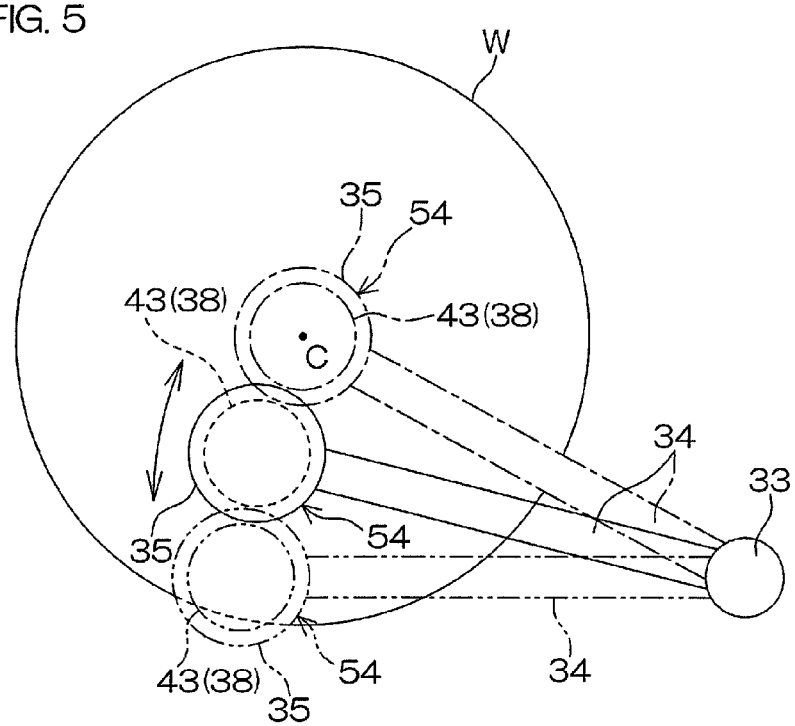
FIG. 5 is a plan view showing the positions of the heater.

FIG. 5 is a plan view showing positions of the heater 54.

The pivot drive mechanism 36 and the lift drive mechanism 37 are controlled to move the heater 54 along an arcuate path crossing a wafer rotating direction above the front surface of the wafer W.

When the wafer W and the SPM liquid present on the wafer W are heated by the heater 54, the heater head 35 is located at the adjacent position at which the bottom plate 52 (lower end face) thereof is opposed to and spaced a minute distance (e.g., 3 mm) from the front surface of the wafer W. During the heating, the bottom plate 52 (lower surface 52B) and the front surface of the wafer W are kept spaced the minute distance from each other.

Examples of the adjacent position include a middle adjacent position (indicated by a solid line in FIG. 5), an edge adjacent position (indicated by a two-dot-and-dash line in FIG. 5) and a center adjacent position (indicated by a one-dot-and-dash line in FIG. 5).

With the heater 54 located at the middle adjacent position, the center of the round heater 54 as seen in plan is opposed to a radially intermediate portion of the front surface of the wafer W (a portion intermediate between the rotation center (on the rotation axis A1) and a peripheral edge portion of the wafer W), and the bottom plate 52 of the heater head 35 is spaced the minute distance (e.g., 3 mm) from the front surface of the wafer W.

With the heater 54 located at the edge adjacent position, the center of the round heater 54 as seen in plan is opposed to the peripheral edge portion of the front surface of the wafer W, and the bottom plate 52 of the heater head 35 is spaced the minute distance (e.g., 3 mm) from the front surface of the wafer W.

With the heater 54 located at the center adjacent position, the center of the round heater 54 as seen in plan is opposed to the rotation center (on the rotation axis A1) of the front surface of the wafer W, and the bottom plate 52 of the heater head 35 is spaced the minute distance (e.g., 3 mm) from the front surface of the wafer W.

Figure 6:
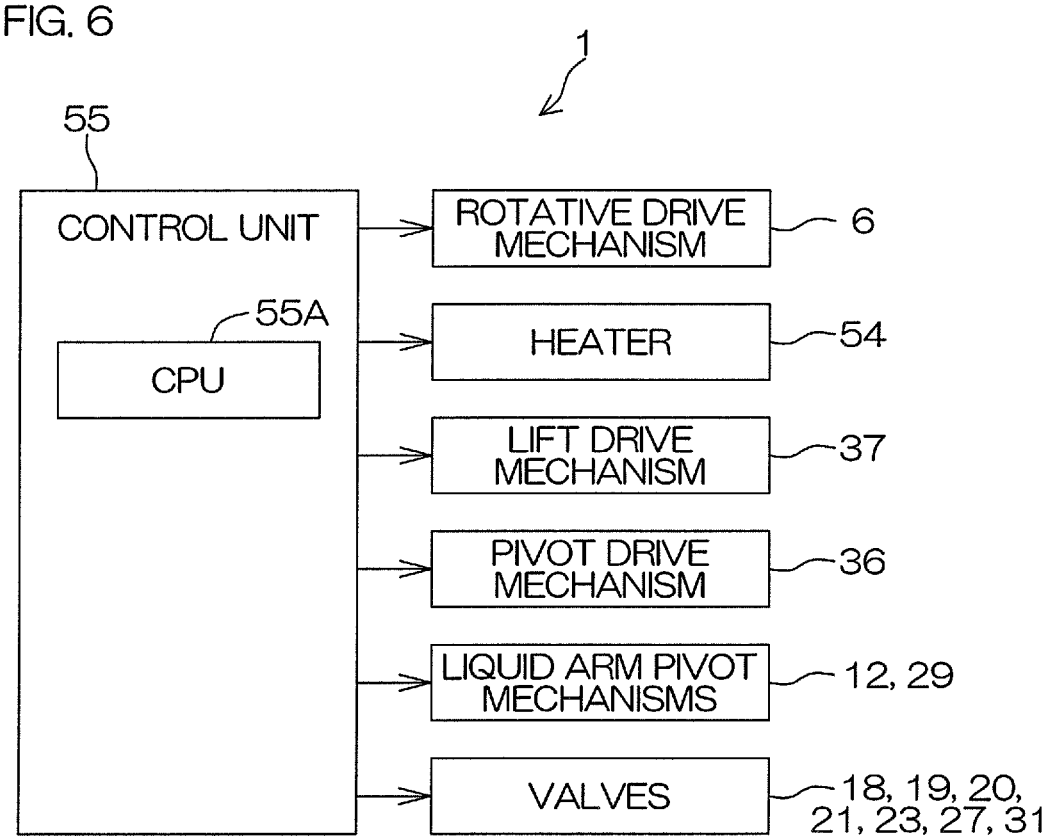
FIG. 6 is a block diagram showing the electrical construction of the treatment unit shown in FIG. 1B.

FIG. 6 is a block diagram showing the electrical construction of the substrate treatment apparatus 1.

The substrate treatment apparatus 1 includes the control unit 55. The control unit 55 is constituted by a microcomputer, and includes a CPU 55A.

The control unit 55 is connected to the rotative drive mechanism 6, the heater 54, the pivot drive mechanism 36, the lift drive mechanism 37, the first liquid arm pivot mechanism 12, the second liquid arm pivot mechanism 29, the sulfuric acid valve 18, the hydrogen peroxide solution valve 20, the lift-off liquid valve 23, the DIW valve 27, the SC1 valve 31, the flow rate control valves 19, 21, and the like, which are controlled by the control unit 55.

Figure 7:
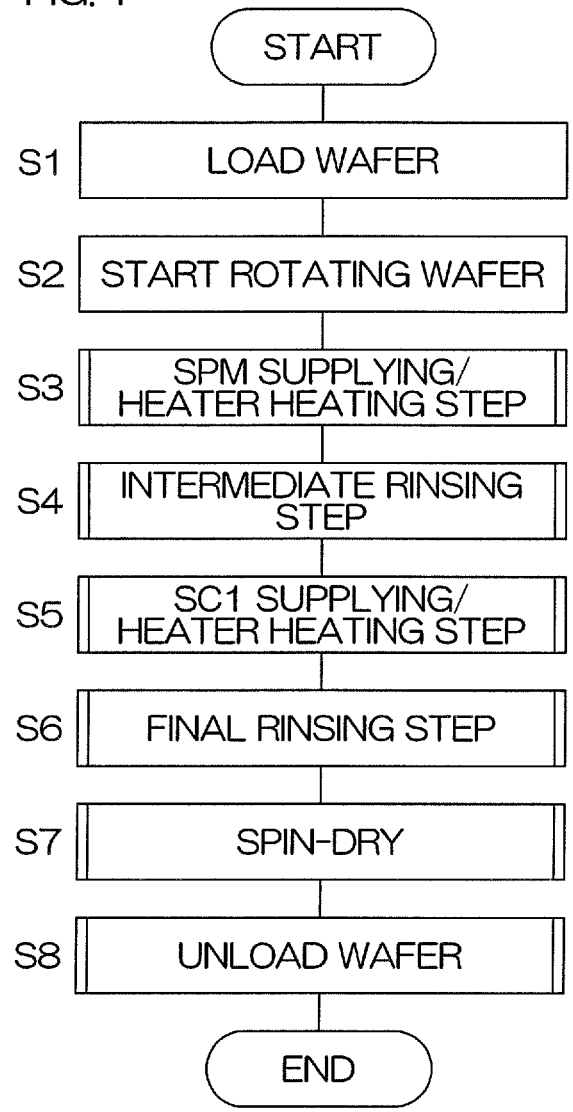
FIG. 7 is a flow chart showing an exemplary resist removing process according to the first embodiment of the present invention.
Figure 8:
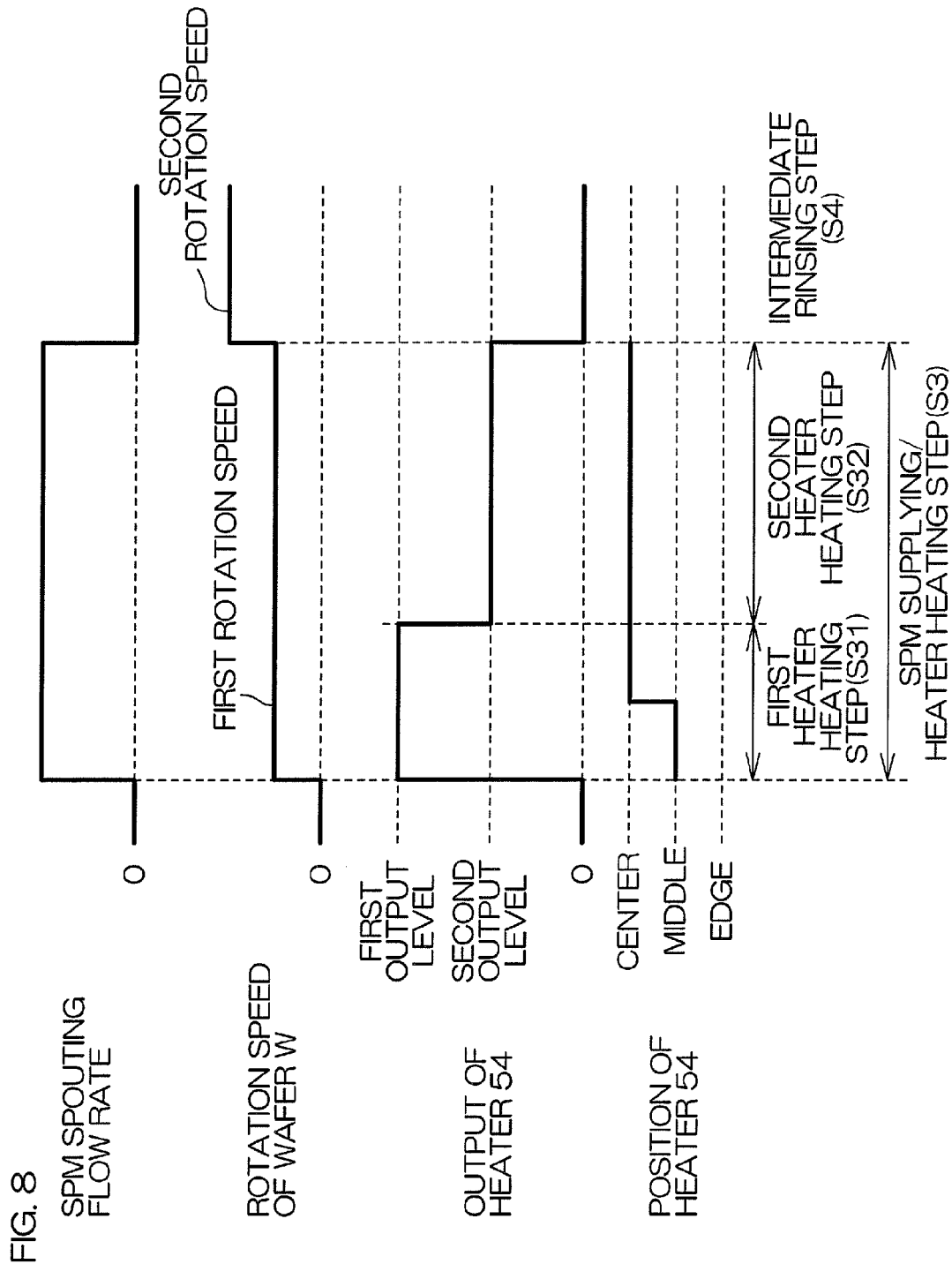
FIG. 8 is a time chart for explaining major steps of the exemplary process shown in FIG. 7.
Figure 9A:
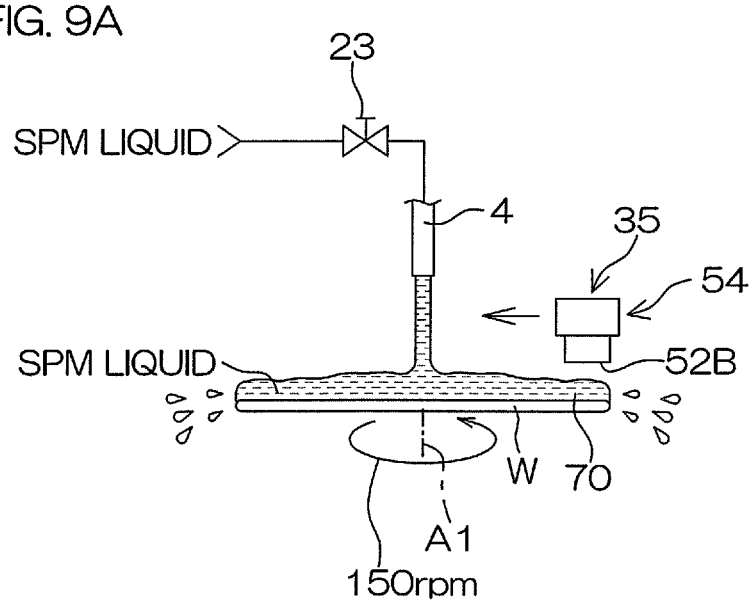
FIGS. 9A and 9B are schematic diagrams for explaining a process step of the exemplary process shown in FIG. 7.
Figure 9B:
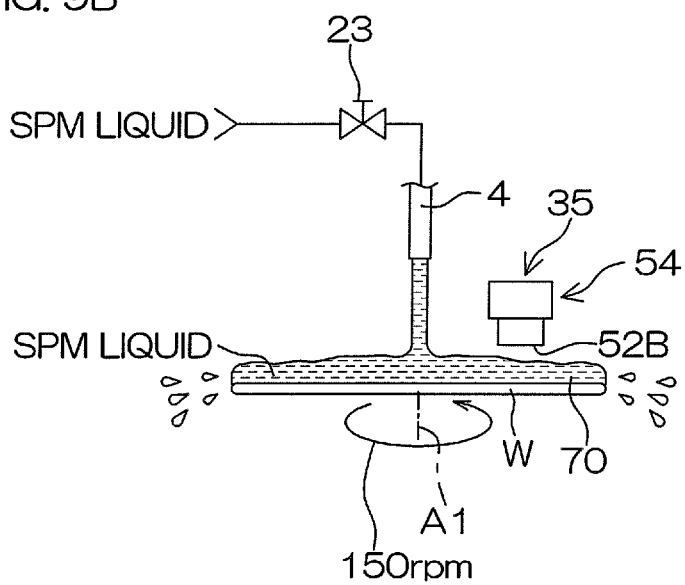

FIG. 7 is a flow chart showing an exemplary resist removing process according to the first embodiment of the present invention. FIG. 8 is a time chart for explaining a control operation to be performed by the CPU 55A mainly in an SPM liquid film forming step and an SPM liquid film heating step to be described later. FIGS. 9A and 9B are schematic diagrams for explaining the SPM liquid film forming step and the SPM liquid film heating step. FIGS. 10A to 10D are schematic diagrams for explaining how to lift off (remove) a resist 72 formed on the front surface of the wafer W. FIG. 11 is a time chart for explaining an SC1 supplying/heater heating step to be described later.

Referring to FIGS. 1A and 1B and FIGS. 6 to 11, the exemplary resist removing process will hereinafter be described.

Prior to the resist removing process, the CPU 55A controls the indexer robot IR (see FIG. 1A) and the center robot CR (see FIG. 1A) to load a wafer W subjected to the ion implantation process into the treatment chamber 2 (Step S1: Wafer loading step). The wafer W is transferred to the wafer holding mechanism 3 with its front surface facing up. At this time, the heater 54, the lift-off liquid nozzle 4 and the SC1 nozzle 25 are located at their home positions so as not to prevent the loading of the wafer W.

Figure 10A:
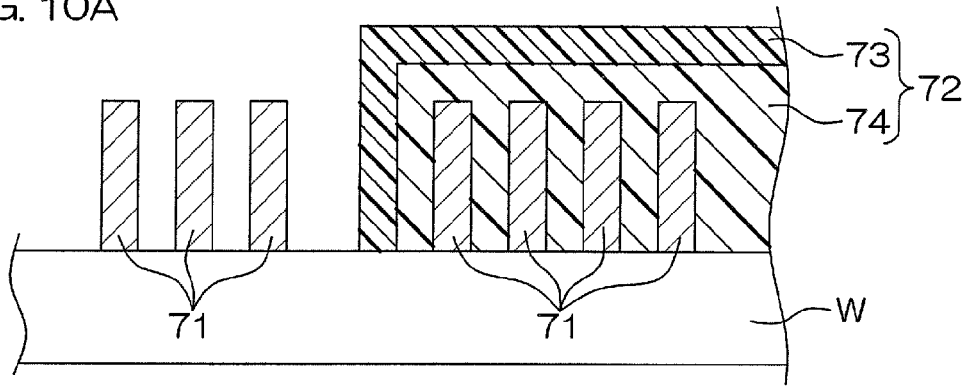
FIGS. 10A to 10D are schematic diagrams for explaining how to lift off a resist formed on a front surface of a wafer.
Figure 11:
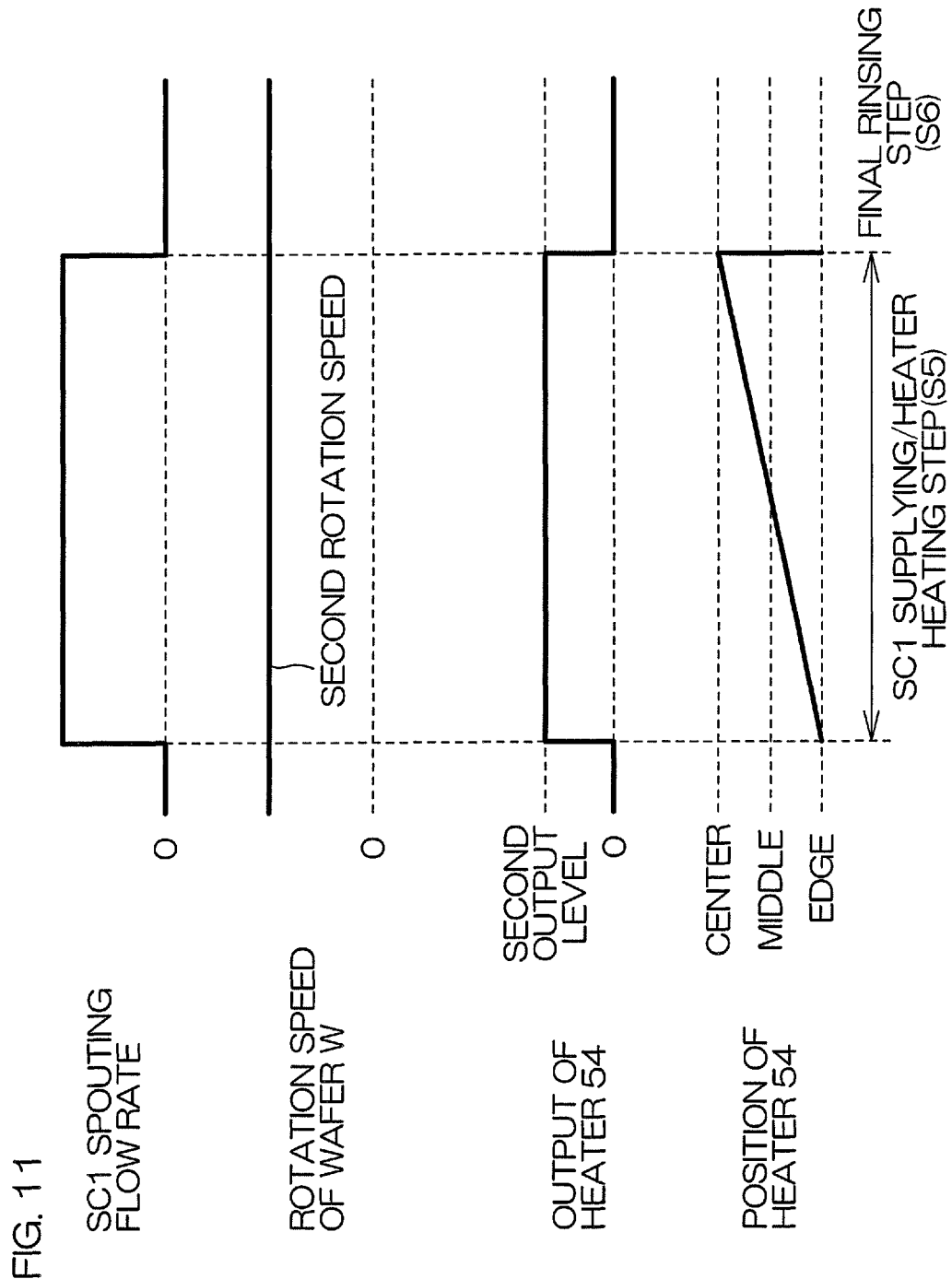
FIG. 11 is a time chart for explaining the process step of the exemplary process shown in FIG. 7.

As shown in FIG. 10A, the wafer W has a predetermined pattern 71 formed on the front surface thereof, and a resist 72 such as of a photosensitive resin is provided as selectively covering the pattern 71. The resist 72 has a hardened surface layer 73 which has been altered (hardened) by the ion implantation process. That is, the resist 72 on the front surface of the wafer W has the hardened layer 73 and an unhardened layer 74 not altered. The wafer W loaded into the treatment chamber 2 is not subjected to a resist ashing process for ashing the resist 72.

With the wafer W held by the wafer holding mechanism 3, the CPU 55A controls the rotative drive mechanism 6 to start rotating the wafer W (Step S2). The rotation speed of the wafer W is increased to a predetermined first rotation speed, and then maintained at the first rotation speed. The first rotation speed is such that the entire front surface of the wafer W can be covered with the SPM liquid, e.g., 150 rpm. The CPU 55A controls the first liquid arm pivot mechanism 12 to move the lift-off liquid nozzle 4 to above the wafer W and locate the lift-off liquid nozzle 4 on the rotation center of the wafer W (on the rotation axis A1).

The CPU 55A opens the sulfuric acid valve 18, the hydrogen peroxide solution valve 20 and the lift-off liquid valve 23 to spout the SPM liquid from the lift-off liquid nozzle 4. The SPM liquid spouted from the lift-off liquid nozzle 4 is supplied to the front surface of the wafer W as shown in FIGS. 8 and 9A. The SPM liquid supplied to the front surface of the wafer W spreads from a center portion of the front surface of the wafer W to a peripheral portion of the front surface of the wafer W by a centrifugal force generated by the rotation of the wafer W. Thus, the SPM liquid spreads over the entire front surface of the wafer W to form a liquid film 70 of the SPM liquid which covers the entire front surface of the wafer W (liquid film retaining step). The SPM liquid film 70 has a thickness of, for example, 1.0 mm.

The CPU 55A controls the pivot drive mechanism 36 and the lift drive mechanism 37 to move the heater 54 to above the edge adjacent position (indicated by the two-dot-and-dash line in FIG. 5) from the home position defined on the lateral side of the wafer holding mechanism 3 and then move the heater 54 to the edge adjacent position.

Further, the CPU 55A controls the heater 54 to start emitting the infrared radiation (Step S31: first heater heating step). At this time, the output of the heater 54 is adjusted to a relatively high first output level (e.g., the maximum output level of the heater 54). Thus, as indicated by arrows in FIG. 10B, the SPM liquid film 70 retained on the front surface of the wafer W is irradiated with the infrared radiation to be thereby heated. Thus, the SPM liquid film 70 is heated to a higher temperature by the heater 54, thereby exhibiting a very high resist lift-off capability. At this time, the front surface of the wafer W is heated to, for example, a temperature of 200° C. or higher.

After a lapse of a predetermined period from the start of the emission of the infrared radiation from the heater 54, the CPU 55A controls the pivot drive mechanism 36 to move the heater 54 (heater arm 34) from the edge adjacent position (indicated by the two-dot-and-dash line in FIG. 5) toward the middle adjacent position (indicated by the solid line in FIG. 5) as shown in FIGS. 9A and 9B (heater moving step). The heater 54 is moved to the middle adjacent position, and located still at the middle adjacent position. That is, the infrared radiation is emitted from the heater 54 located at the middle adjacent position.

In the first heater heating step of Step S31, the CPU 55A causes the heater 54 to emit the infrared radiation for a predetermined first heater heating period. The first heater heating period is such that the front surface of the wafer W is not overheated, for example, 30 seconds. Thus, as shown in FIG. 10C, most of the hardened surface layer 73 of the resist 72 can be removed without damaging the front surface of the wafer W and the predetermined pattern 71.

It is noted that the first heater heating step of Step S31 and the following second heater heating step of Step S32 are collectively referred to as "SPM supplying/heater heating step (Step S3)" (heater heating step). The heater 54 emits the infrared radiation throughout the SPM supplying/heater heating step of Step S3.

After a lapse of the first heater heating period from the start of the emission of the infrared radiation from the heater 54, the CPU 55A controls the heater 54 to change the output of the heater 54 from the first output level to the second output level with the heater 54 located at the middle adjacent position as shown in FIGS. 8 and 9B (Step S32: second heater heating step). The second output level is set at an output level lower than the first output level (e.g., 50% of the maximum output level of the heater 54).

Figure 10B:
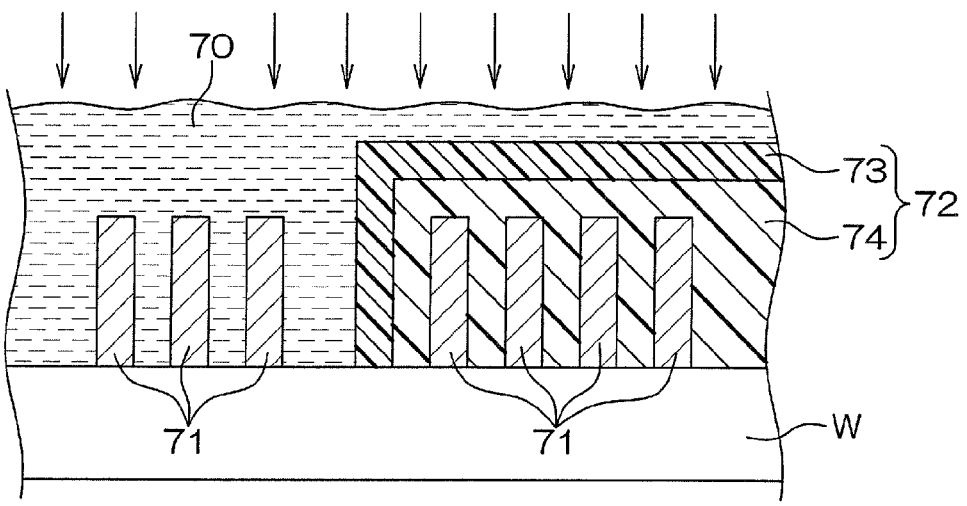
Figure 10C:
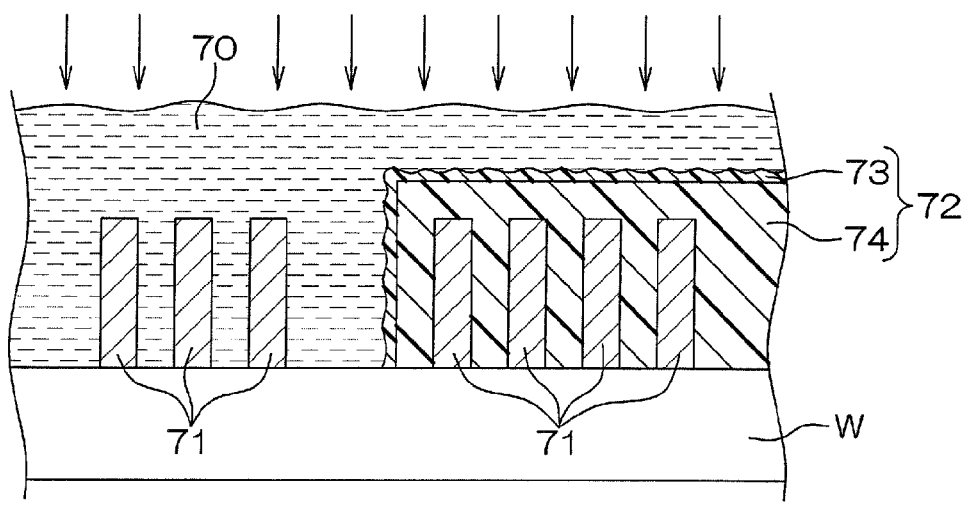

In the second heater heating step of Step S32, the heater 54 emits the infrared radiation for a second heater heating period predetermined in the same manner as the first heater heating period (see arrows in FIG. 10C). The second heater heating period is, for example, 30 seconds to 60 seconds. In the second heater heating step, the output of the heater 54 is set at a relatively low output level. Even in this case, the SPM liquid can be maintained at a high temperature (e.g., 160° C.).

Figure 10D:
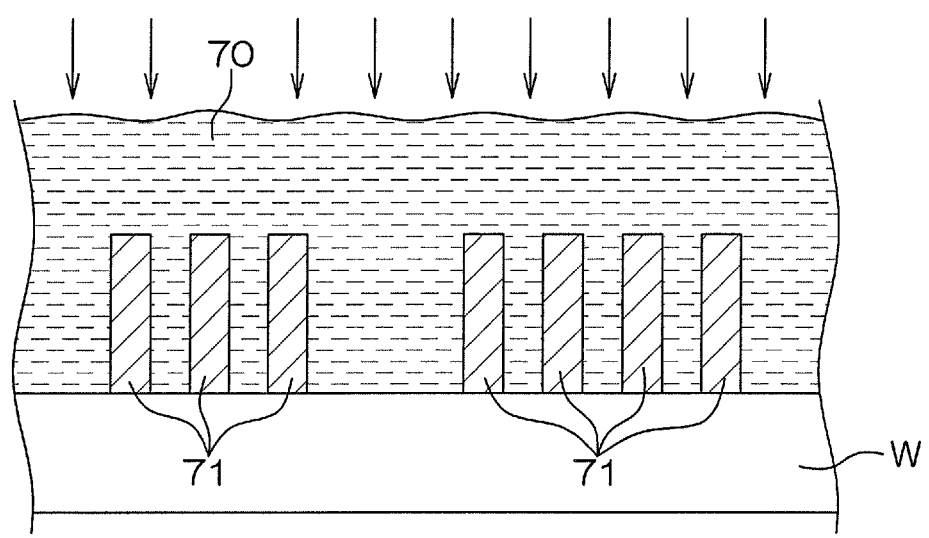

A residue of the resist 72 remaining on the front surface of the wafer W after the first heater heating step of Step S31 is such that the hardened surface layer 73 is mostly removed from the surface of the resist 72 as shown in FIG. 10C. Even if the output of the heater 54 is lower, therefore, the SPM liquid in the liquid film 70 kept at the high temperature can advantageously remove the remaining resist 72 including the thinner hardened layer 73 and the unhardened layer 74. Thus, as shown in FIG. 10D, the resist 72 can be removed from the front surface of the wafer W without damaging the front surface of the wafer W and the predetermined pattern 71.

After a lapse of the second heater heating period from the start of the emission of the infrared radiation from the heater 54, the CPU 55A closes the sulfuric acid valve 18 and the hydrogen peroxide solution valve 20, and controls the heater 54 to stop the emission of the infrared radiation. Further, the CPU 55A controls the pivot drive mechanism 36 and the lift drive mechanism 37 to move the heater 54 back to the home position.

Then, the CPU 55A controls the rotative drive mechanism 6 to increase the rotation speed of the wafer W to a second rotation speed (in a range of 300 rpm to 1500 rpm, e.g., 1000 rpm) that is higher than the first rotation speed.

Further, the CPU 55A opens the DIW valve 27 to supply the DIW from the spout of the DIW nozzle 24 toward around the rotation center of the wafer W (Step S4: intermediate rinsing step). The DIW supplied onto the front surface of the wafer W receives a centrifugal force generated by the rotation of the wafer W to flow toward the peripheral edge of the wafer W on the front surface of the wafer W. Thus, SPM liquid adhering to the front surface of the wafer W is rinsed away with the DIW. After a lapse of a predetermined period from the start of the supply of the DIW, the CPU 55A closes the DIW valve 27 to stop supplying the DIW to the front surface of the wafer W.

While maintaining the rotation speed of the wafer W at the second rotation speed as shown in FIG. 11, the CPU 55A opens the SC1 valve 31 to supply the SC1 from the SC1 nozzle 25 to the front surface of the wafer W (Step S5: SCI supplying/heater heating step). The CPU 55A controls the second liquid arm pivot mechanism 29 to pivot the second liquid arm 28 within the predetermined angular range to reciprocally move the SC1 nozzle 25 between a position above the rotation center of the wafer W and a position above the peripheral edge of the wafer W. Thus, an SC1 supply position on the front surface of the wafer W to which the SC1 is supplied from the SC1 nozzle 25 is reciprocally moved along an arcuate path crossing the wafer rotating direction in a range from the rotation center of the wafer W to the peripheral edge of the wafer W. Thus, the SC1 spreads over the entire front surface of the wafer W, whereby a thin liquid film of the SC1 is formed as covering the entire front surface of the wafer W.

The CPU 55A controls the pivot drive mechanism 36 and the lift drive mechanism 37 to move the heater 54 from the home position defined on the lateral side of the wafer holding mechanism 3 to above the edge adjacent position and then down to the edge adjacent position, and move the heater 54 toward the center adjacent position at a predetermined speed. At this time, the method of scanning the SC1 nozzle 25 and the heater 54 is determined so as to prevent the SC1 nozzle 25 and the heater 54 from interfering with each other.

The CPU 55A controls the heater 54 to start the emission of the infrared radiation. In FIG. 11, the output of the heater 54 is maintained at the second output level as in the second heater heating step of Step S32 by way of example, but may be maintained at an output level different from the second output level as long as the heat can be applied to a portion of the SC1 liquid film present around the interface between the SC1 liquid film and the front surface of the wafer W without damaging the front surface of the wafer W. Thus, the SC1 can be evenly supplied to the entire front surface of the wafer W, whereby the residue of the resist 72 remaining on the front surface of the wafer W and the like can be efficiently cleaned off. The SC1 liquid film, which is heated by the heater 54, exhibits a very high cleaning capability. As a result, the cleaning efficiency can be significantly improved.

After the supply of the SC1 is continued for a predetermined SC1 supplying period, the CPU 55A closes the SC1 valve 31, and controls the second liquid arm pivot mechanism 29 to move the SC1 nozzle 25 back to the home position.

While maintaining the rotation speed of the wafer W at the second rotation speed, the CPU 55A opens the DIW valve 27 to supply the DIW from the spout of the DIW nozzle 24 toward around the rotation center of the wafer W (Step S6: final rinsing step). The DIW supplied to the front surface of the wafer W receives a centrifugal force generated by the rotation of the wafer W to flow toward the peripheral edge of the wafer W on the front surface of the wafer W, whereby SC1 adhering to the front surface of the wafer W is rinsed away with the DIW. It is noted that the rinse liquid to be used in the intermediate rinsing step of Step S4 and the final rinsing step of Step S6 is not limited to the DIW, but other examples of the rinse liquid include carbonated water, electrolytic ion water, ozone water, reduced water (hydrogen water) and magnetic water.

After a lapse of a predetermined period from the start of the final rinsing step, the CPU 55A closes the DIW valve 27 to stop supplying the DIW to the front surface of the wafer W. Thereafter, the CPU 55A drives the rotative drive mechanism 6 to increase the rotation speed of the wafer W to a predetermined higher rotation speed (e.g., 1500 to 2500 rpm), whereby a spin drying process is performed to spin off the DIW from the wafer W to dry the wafer W (Step S7). In the spin drying process of Step S7, DIW adhering to the wafer W is removed from the wafer W.

After the spin drying process is performed for a predetermined spin drying period, the CPU 55A controls the rotative drive mechanism 6 to stop rotating the wafer holding mechanism 3. Thus, the resist removing process is completed for the single wafer W, and the treated wafer W is unloaded from the treatment chamber 2 by the transport robot (Step S8).

According to this embodiment, as described above, the output of the heater 54 is adjusted at the relatively high first output level in the first heater heating step of Step S31. The SPM liquid film 70 retained on the front surface of the wafer W (see FIGS. 9A and 9B) is heated by the heater 54, thereby exhibiting a very high resist lift-off capability. Thus, as shown in FIGS. 10B and 10C, the hardened surface layer 73 present in the surface of the resist 72 can be advantageously removed. Then, the first heater heating step ends before the front surface of the wafer is overheated. The residue of the resist 72 remaining on the front surface of the wafer W after the first heater heating step is such that the hardened surface layer 73 is mostly removed from the surface of the resist 72 as shown in FIG. 10C. Even if the output of the heater 54 is lower, therefore, the SPM liquid in the liquid film 70 kept at the high temperature can advantageously remove the remaining resist 72 including the thinner hardened layer 73 and the unhardened layer 74.

After the first heater heating step ends, the second heater heating step of Step S32 is performed. In the second heater heating step, the output of the heater 54 is set at a lower output level than in the first heater heating step. Even in this case, the SPM liquid in the liquid film 70 is maintained at a high temperature, so that the resist 72 remaining on the front surface of the wafer W can be advantageously removed as shown in FIG. 10D in the second heater heating step.

As described above, even the resist 72 having the hardened layer 73 can be advantageously removed from the front surface of the wafer W without ashing the resist 72. At this time, the front surface of the wafer W and the predetermined pattern 71 are not damaged.

FIG. 12 is a time chart showing an exemplary resist removing process according to a second embodiment of the present invention. The resist removing process according to the second embodiment of the present invention is different from the resist removing process according to the first embodiment of the present invention in that a heater preheating step of Step S9 shown in FIG. 12 is performed prior to the SPM supplying/heater heating step of Step S3 shown in FIG. 8. Other steps are performed in the same manner as in the resist removing process according to the first embodiment. Therefore, only the heater preheating step of Step S9 in the resist removing process according to the second embodiment will be described, and duplicate description of the other steps will be omitted.

In the second embodiment, the CPU 55A controls the pivot drive mechanism 36 and the lift drive mechanism 37 to move the heater 54 from the home position defined on the lateral side of the wafer holding mechanism 3 to above the middle adjacent position (indicated by the solid line in FIG. 5) after the rotation of the wafer W is started (step S2).

After the heater 54 is located still above the middle adjacent position, the CPU 55A further controls the heater 54 to start the emission of the infrared radiation (Step S9: heater preheating step). In FIG. 12, the output of the heater 54 is adjusted at the first output level as described in the first embodiment by way of example, but may be adjusted at an output level such that the wafer W can be sufficiently heated.

In the heater preheating step of Step S9, the CPU 55A causes the heater 54 to emit the infrared radiation for a predetermined heater preheating period. The heater preheating period is, for example, 10 seconds to 20 seconds. In the heater preheating step of Step S9, the wafer W is warmed.

After a lapse of the predetermined heater preheating period, the CPU 55A controls the heater 54 to stop the emission of the infrared radiation while maintaining the rotation speed of the wafer W at the first rotation speed. Further, the CPU 55A controls the pivot drive mechanism 36 and the lift drive mechanism 37 to move the heater 54 from the middle adjacent position to the edge adjacent position and locate the heater 54 at the edge adjacent position.

Then, Steps S3 to S8 are performed in the same manner as in the first embodiment.

In the second embodiment, the same effects can be provided as in the first embodiment. In addition, the following effects are provided.

The heater preheating step (Step S9) of preliminarily heating the wafer W by the heater 54 is performed prior to the first heater heating step of Step S31. If the heater preheating step of Step S9 is not performed, the SPM liquid is supplied to a cold wafer W. Therefore, a certain period of time is required to sufficiently heat the SPM liquid film 70 retained on the front surface of the wafer W. The resist lift-off capability of the SPM liquid is not sufficient until the temperature of the SPM liquid film 70 is increased. As a result, a longer period of time is required.

Where the heater preheating step of Step S9 is performed, on the other hand, the wafer W is preliminarily warmed. Therefore, the heating of the SPM liquid is started simultaneously with the supply of the SPM liquid to the front surface of the wafer W, thereby reducing the time required for sufficiently increasing the temperature of the SPM liquid film 70 retained on the front surface of the wafer W. That is, the SPM liquid treatment period (the total period of the first heater heating period and the second heater heating period) in the first embodiment can be reduced. As a result, the consumption of the SPM liquid can be effectively reduced.

While two embodiments of the present invention have thus been described, the invention may be embodied in other ways.

In the embodiments described above, the wafer W is rotated at the first rotation speed in the SPM supplying/heater heating step of Step S3 by way of example, but the rotation speed of the wafer W may be changed (e.g., reduced) or the rotation of the wafer W may be stopped in the SPM supplying/heater heating step of Step S3.

In the embodiments described above, the SPM liquid is spouted at a predetermined spouting flow rate during the period of the SPM supplying/heater heating step of Step S3 by way of example, but the spouting flow rate of the SPM liquid may be changed in the SPM supplying/heater heating step of Step S3. Where the rotation speed of the wafer W is changed in the SPM supplying/heater heating step of Step S3, the spouting flow rate of the SPM liquid may be changed according to the rotation speed of the wafer W.

In the embodiments described above, the heater 54 is first located at the edge adjacent position, and then at the middle adjacent position in the SPM supplying/heater heating step of Step S3 by way of example. Alternatively, the heater 54 may be first located at the middle adjacent position, and then at the edge adjacent position.

The combination of the positions of the heater 54 is not limited to a combination of the edge adjacent position and the middle adjacent position, but may be a combination of the edge adjacent position and the center adjacent position (indicated by the one-dot-and-dash line in FIG. 5), or may be a combination of the middle adjacent position and the center adjacent position. Even in this case, the entire front surface of the wafer W can be evenly heated. When the heater 54 is located at the center adjacent position, the method of scanning the lift-off liquid nozzle 4 and the heater 54 may be determined so as to prevent the lift-off liquid nozzle 4 and the heater 54 from interfering with each other.

In the SPM supplying/heater heating step of Step S3, the heater 54 may be moved along the front surface of the wafer W. The pivoting range may be between the edge adjacent position and the center adjacent position, between the edge adjacent position and the middle adjacent position or between the center adjacent position and the middle adjacent position. In this case, the method of scanning the lift-off liquid nozzle 4 and the heater 54 may be determined so as to prevent the lift-off liquid nozzle 4 and the heater 54 from interfering with each other.

During the entire period of the SPM supplying/heater heating step of Step S3, the heater 54 may be located still at the edge adjacent position, the middle adjacent position, the center adjacent position or the like.

In the embodiments described above, the SPM liquid film 70 retained on the front surface of the wafer W is heated with the output of the heater 54 set at the second output level lower than the first output level in the second heater heating step of Step S32 by way of example, but the CPU 55A may control the heater 54 to stop the emission of the infrared radiation after the first heater heating step of Step S31 (i.e., the second output level may be set at zero). In this case, the SPM liquid film 70 retained on the front surface of the wafer W is heated by heat remaining in the heater 54 and the wafer W.

In the embodiments described above, the SPM liquid film 70 is heated through a two-level infrared emission by changing the output of the heater 54 from the first output level to the second output level in the SPM supplying/heater heating step of Step S3 by way of example, but the output of the heater 54 may be reduced stepwise from the first output level to the second output level, or may be continuously reduced from the first output level to the second output level.

In the embodiments described above, the output of the heater 54 is changed from the first output level to the second output level lower than the first output level in the SPM supplying/heater heating step of Step S3 by way of example, but may be changed to an output level higher than the first output level. In this case, the output of the heater 54 may be changed to the output level higher than the first output level, and then to the second output level. After being changed to the second output level, the output of the heater 54 may be further changed to an output level that is higher than the second output level and lower than the first output level.

In the first embodiment described above, the output of the heater 54 is changed from the first output level to the second output level lower than the first output level in the SPM supplying/heater heating step of Step S3 by way of example, but the SPM liquid film 70 may be heated with the output of the heater 54 set at an output level lower than the first output level prior to the first heater heating step of Step S31. In this case, the SPM liquid film 70 is heated to a heating temperature lower than the heating temperature attained by setting the output of the heater 54 at the first output level, so that the SPM liquid film 70 is not suddenly heated to a higher temperature. Thus, the hardened layer 73 of the resist 72 can be damaged to some extent and, in this state, the first heater heating step of Step S31 is performed. Thus, the hardened layer 73 of the resist 72 can be damaged stepwise to be thereby advantageously removed.

In the embodiments described above, the SC1 supplying/heater heating step of Step S5 is performed in a different manner from the SPM supplying/heater heating step of Step S3 by way of example, but may be performed in the same manner as the SPM supplying/heater heating step of Step S3.

In the second embodiment described above, the heater 54 is located still at the middle adjacent position in the heater preheating step of Step S9 by way of example, but may be located still at the edge adjacent position or the center adjacent position in the heater preheating step.

In the heater preheating step of Step S9, the heater 54 may be moved along the front surface of the wafer W. The movement range of the heater 54 may be between the edge adjacent position and the center adjacent position, between the edge adjacent position and the middle adjacent position, or between the center adjacent position and the middle adjacent position.

In the second embodiment described above, the emission of the infrared radiation from the heater 54 is once stopped after the heater preheating step of Step S9, and then the first heater heating step of Step S31 is performed by way of example. Alternatively, the heater preheating step of Step S9 may be continuously followed by the first heater heating step of Step S31 by starting the supply of the SPM liquid without stopping the emission of the infrared radiation from the heater 54. In this case, the SPM liquid film 70 may be heated with the output of the heater 54 set at an output level lower than the first output level prior to the first heater heating step of Step S31.

In the embodiments described above, the resist removing process is performed on the wafer W by way of example, but the present invention is applicable to an etching process typified by a phosphoric acid etching process. In this case, etching liquids such as a phosphoric acid aqueous solution and a hydrofluoric acid aqueous solution, and cleaning chemical liquids such as SC1 and SC2 (hydrochloric acid/hydrogen peroxide mixtures) may be used as the treatment liquid.

In the embodiments described above, the infrared lamp 38 including the single annular lamp is used by way of example but not by way of limitation. Alternatively, the infrared lamp 38 may include a plurality of annular lamps disposed coaxially with each other, or may include a plurality of linear lamps disposed parallel to each other in a horizontal plane.

While the present invention has been described in detail by way of the embodiments thereof, it should be understood that these embodiments are merely illustrative of the technical principles of the present invention but not limitative of the invention. The spirit and scope of the present invention are to be limited only by the appended claims.

This application corresponds to Japanese Patent Application No. 2013-187627 filed in the Japan Patent Office on Sep. 10, 2013, the disclosure of which is incorporated herein by reference in its entirety.

What is claimed is:

1. A substrate treatment method comprising:
a liquid film retaining step of retaining a liquid film of a treatment liquid on an upper surface of a substrate;
a locating step of locating a heater having a smaller diameter than the upper surface of the substrate in opposed relation to the upper surface of the substrate;
a first heater heating step of setting an output of the heater at a first non-zero output level to heat the treatment liquid film on the upper surface of the substrate;
a heater moving step of moving the heater along the upper surface of the substrate in the first heater heating step; and
a second heater heating step of changing the output of the heater to a second non-zero output level which is lower than the first output level to heat the treatment liquid film on the upper surface of the substrate after the first heater heating step;
wherein the heater is stationary in the second heater heating step; and
wherein the heater moving step includes a step of moving the heater from an edge position in which the heater is opposed to a peripheral edge portion of the upper surface of the substrate, to a middle position in which the heater is not opposed to either the peripheral edge portion or a center portion of the upper surface of the substrate, but is opposed only to a portion which is intermediate between the center portion of the upper surface of the substrate and the peripheral edge portion of the upper surface of the substrate.

2. The substrate treatment method according to claim 1, further comprising a heater preheating step of preliminarily heating the substrate before the first heater heating step.

3. The substrate treatment method according to claim 1, wherein the treatment liquid is a resist lift-off liquid containing sulfuric acid.

4. The substrate treatment method according to claim 1, wherein in the second heater heating step, the heater is located stationary at the middle position in which the heater is not opposed to either the peripheral edge portion or a center portion of the upper surface of the substrate, but is opposed only to a portion which is intermediate between the center portion of the upper surface of the substrate and the peripheral edge portion of the upper surface of the substrate.

5. A substrate treatment method comprising:
a liquid film retaining step of retaining a liquid film of a treatment liquid on an upper surface of a substrate;
a locating step of locating a heater having a smaller diameter than the upper surface of the substrate in opposed relation to the upper surface of the substrate;
a first heater heating step of setting an output of the heater at a first non-zero output level to heat the treatment liquid film on the upper surface of the substrate;
a heater moving step of moving the heater along the upper surface of the substrate in the first heater heating step; and
a second heater heating step of changing the output of the heater to a second non-zero output level which is lower than the first output level to heat the treatment liquid film on the upper surface of the substrate after the first heater heating step;
wherein the heater is stationary in the second heater heating step; and
wherein in the second heater heating step, the heater is located stationary at a middle position in which the heater is not opposed to either a peripheral edge portion or a center portion of the upper surface of the substrate, but is opposed only to a portion which is intermediate between the center portion of the upper surface of the substrate and the peripheral edge portion of the upper surface of the substrate.

6. The substrate treatment method according to claim 5, further comprising a heater preheating step of preliminarily heating the substrate before the first heater heating step.

7. The substrate treatment method according to claim 5, wherein the treatment liquid is a resist lift-off liquid containing sulfuric acid.

* * * * *